(12) United States Patent
Tsai et al.

(10) Patent No.: US 12,190,945 B2
(45) Date of Patent: *Jan. 7, 2025

(54) SRAM POWER-UP RANDOM NUMBER GENERATOR

(71) Applicant: Taiwan Semiconductor Manufacturing Company, Ltd., Hsinchu (TW)

(72) Inventors: Jui-Che Tsai, Tainan (TW); Chen-Lin Yang, Zhubei (TW); Yu-Hao Hsu, Tainan (TW); Shih-Lien Linus Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/298,045

(22) Filed: Apr. 10, 2023

(65) Prior Publication Data

US 2023/0245696 A1  Aug. 3, 2023

Related U.S. Application Data

(63) Continuation of application No. 17/359,994, filed on Jun. 28, 2021, now Pat. No. 11,626,157, which is a
(Continued)

(51) Int. Cl.
*G11C 11/418* (2006.01)
*G06F 7/58* (2006.01)
(Continued)

(52) U.S. Cl.
CPC ............ *G11C 11/418* (2013.01); *G06F 7/588* (2013.01); *G11C 5/147* (2013.01); *G11C 7/12* (2013.01); *G11C 8/08* (2013.01)

(58) Field of Classification Search
CPC ......... G11C 11/418; G11C 5/147; G11C 7/12; G11C 8/08; G11C 7/24; G11C 11/417; G06F 7/588; G06N 7/01
See application file for complete search history.

(56) References Cited

U.S. PATENT DOCUMENTS 10,613,832 B2   4/2020   Ho et al.
11,049,555 B1   6/2021   Tsai et al.
(Continued)

FOREIGN PATENT DOCUMENTS

CN         109656514 A     4/2019
KR     10-2019-0093905 A   8/2019
(Continued)

OTHER PUBLICATIONS

Li, D., Lu, Z., Zou, X., & Liu, Z. (2015). Pufkey: a high-security and high-throughput hardware true random number generator for sensor networks. Sensors (Basel, Switzerland), 15(10), 26251-26266. https://doi.org/10.3390/s151026251 (Year: 2015).

*Primary Examiner* — Ajay Ojha
(74) *Attorney, Agent, or Firm* — Merchant & Gould P.C.

(57) ABSTRACT

A memory device includes a memory cell array including a plurality of bit cells, each of the bit cells coupled to one of a plurality of bit lines and one of a plurality of word lines, respectively, wherein each of the plurality of bit cells is configured to: present an initial logic state during a random number generator (RNG) phase; and operate as a memory cell at a first voltage level during a SRAM phase; and a controller controlling bit line signals on the plurality of bit lines and word line signals on the plurality of word lines, wherein the controller is configured to: during the RNG phase, precharge the plurality of bit lines to a second voltage level, and determine the initial logic states of the plurality of
(Continued)

bit cells to generate at least one random number, wherein the second voltage level is lower than the first voltage level.

20 Claims, 11 Drawing Sheets

Related U.S. Application Data continuation of application No. 16/869,856, filed on May 8, 2020, now Pat. No. 11,049,555.

(51) Int. Cl.
*G11C 5/14* (2006.01)
*G11C 7/12* (2006.01)
*G11C 8/08* (2006.01)

(56) References Cited

U.S. PATENT DOCUMENTS

| | | | |
|---|---|---|---|
| 11,626,157 B2 | 4/2023 | Tsai et al. | |
| 2011/0022648 A1* | 1/2011 | Harris | G06F 7/588 |
| | | | 708/254 |
| 2015/0380077 A1 | 12/2015 | Wu et al. | |
| 2017/0301732 A1* | 10/2017 | Shepard | H10B 63/24 |
| 2018/0046436 A1 | 2/2018 | Lu | |
| 2019/0165938 A1 | 5/2019 | Lu et al. | |
| 2019/0354672 A1 | 11/2019 | Cambou | |
| 2020/0382293 A1 | 12/2020 | Cambou | |

FOREIGN PATENT DOCUMENTS

| | | |
|---|---|---|
| TW | 201818235 A | 5/2018 |
| TW | 201918919 A | 5/2019 |
| WO | 2016/100402 A1 | 6/2016 |

* cited by examiner

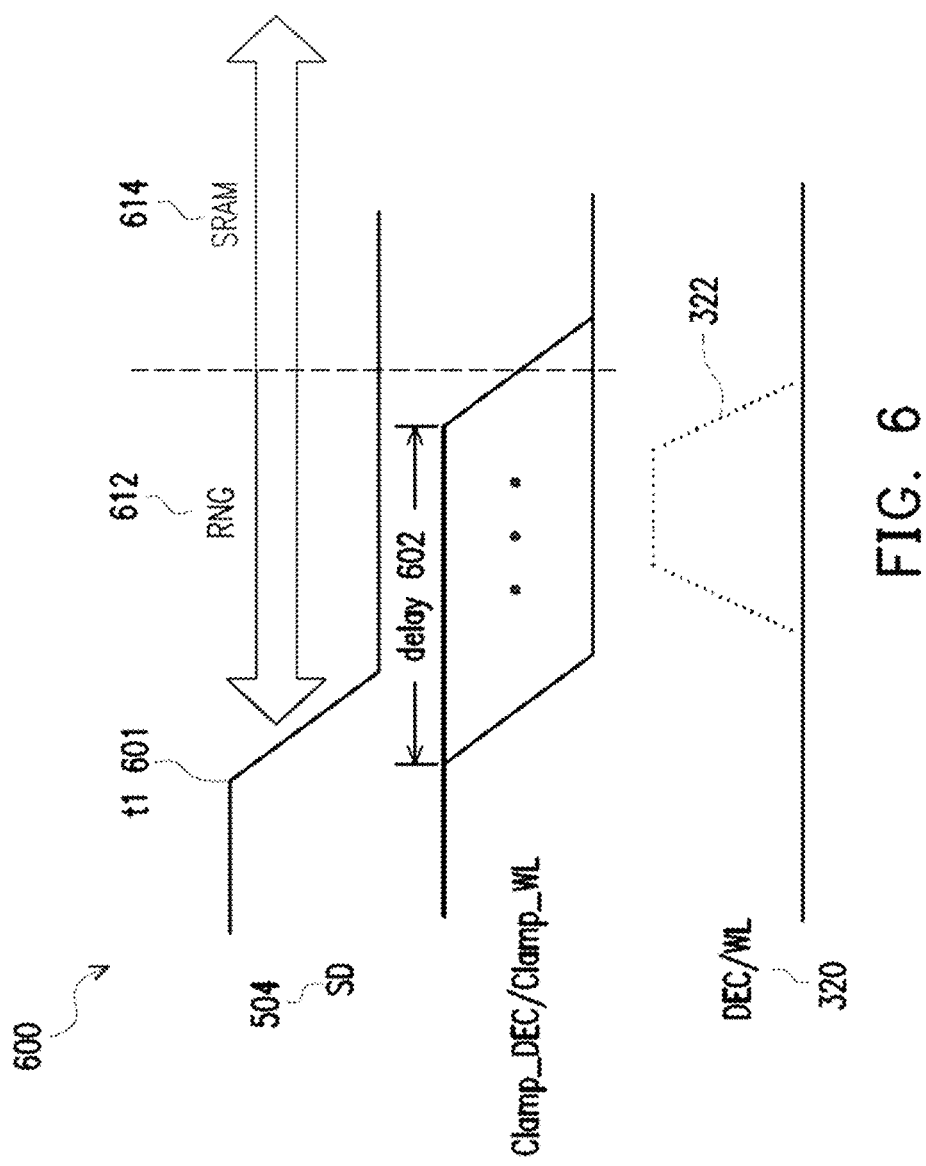

SRAM POWER-UP RANDOM NUMBER GENERATOR

CROSS-REFERENCE TO RELATED APPLICATION

This application is a continuation of application Ser. No. 17/359,994, filed Jun. 28, 2021, now U.S. Pat. No. 11,626,157, which is a continuation of application Ser. No. 16/869,856, filed May 8, 2020, now U.S. Pat. No. 11,049,555, which are incorporated herein by reference.

BACKGROUND

A random number generator (RNG) is a device that generates a sequence of numbers or symbols that cannot be reasonably predicted better than by a random chance. RNG is widely used in security applications because they are unpredictable for potential attackers. These random numbers generated by a RNG can be generated either by a truly random (i.e., non-deterministic) physical source or by means of a deterministic algorithm. A general RNG architecture may combine both RNG types (i.e., non-deterministic and deterministic). Specifically, a non-deterministic RNG is used to provide a non-deterministic seed, which is used as input for a deterministic random bit generator (DRBG) algorithm that generates a larger amount of pseudorandom bits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a timing diagrams of an example of the SRAM power-up RNG in accordance with some embodiments.

DETAILED DESCRIPTION

Figure 1:
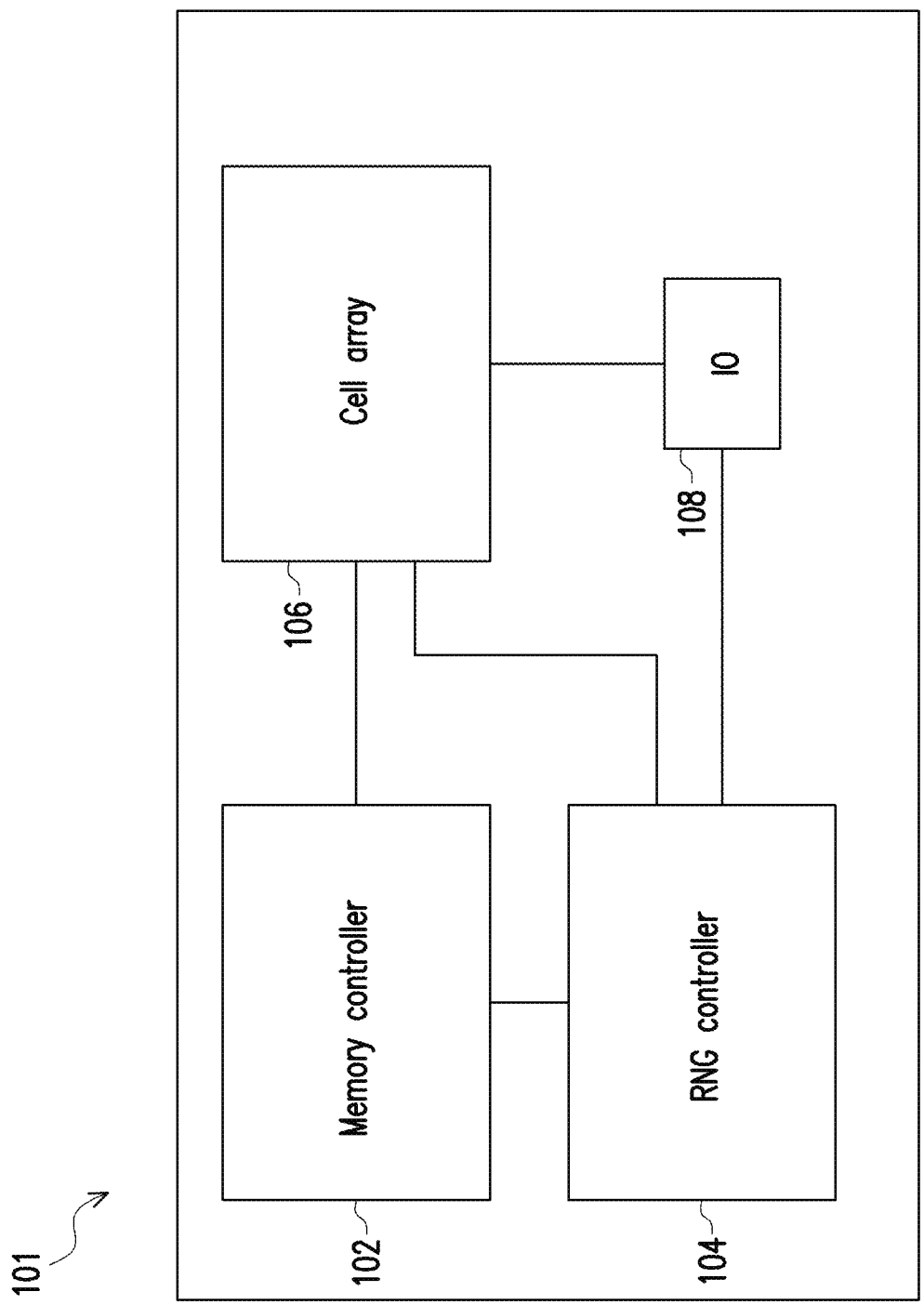
FIG. 1 is a block diagram of an example of an SRAM RNG in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Static random access memory (SRAM) is a type of semiconductor memory that uses bi-stable latching circuitry to store each bit in a memory array. SRAM maintains data in the memory array without the need to be refreshed when powered, but is still volatile such that data is eventually lost when the memory is not powered. Power gating and voltage retention techniques are commonly implemented to the memory array to reduce power consumption. For example, power gates may be used to turn off memory periphery items in a deep sleep mode, and both the periphery items and the memory array in a shutdown mode.

FIG. 1 is a block diagram illustrating an example of an SRAM random number generator (RNG) 101 in accordance with some embodiments. In this embodiment, the SRAM RNG 101 includes at least a memory controller 102, a RNG controller 104, a cell array 200 and an input/output (IO) unit 108. The cell array 200 includes multiple bit cells arranged in an array manner, which will be described in detail below with reference to FIG. 2A and FIG. 2B. The memory controller 102 is connected to the cell array 200 and controls the general operation of the cell array 200. The RNG controller 104 is also connected to the cell array 200 and controls the RNG-related operations of the cell array 200, which will be described in detail below with reference to FIG. 5 and FIG. 6. In some embodiments, the RNG controller 104 may be part of the memory controller 102. In other words, the RNG controller 104 and the memory controller 102 may be combined together. The IO unit 108 is connected to the cell array 200, the memory controller 102 and the RNG controller 104. The IO unit 108 controls the flow of data, address and control signals into and out of the cell array 200.

Figure 2A:
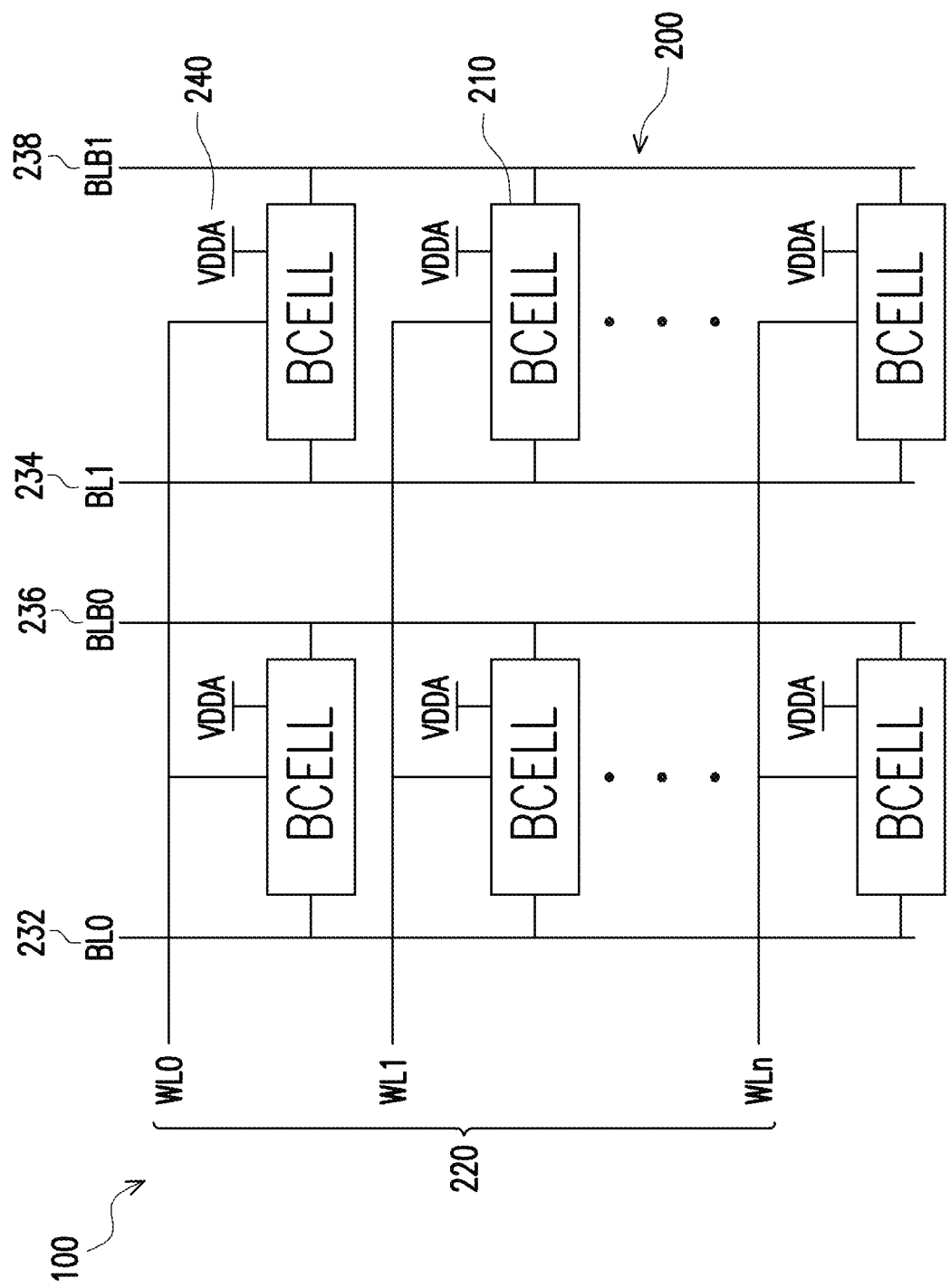
FIG. 2A is a block diagram of an example of an SRAM device in accordance with some embodiments.

FIG. 2A shows aspects of an example of the cell array 200 of the SRAM RNG device 101 in accordance with some embodiments. As shown in FIG. 2A, the cell array 200 includes multiple bit cells 210 arranged in an array manner. For simplicity, in this embodiment the cell array 200 has n rows and two columns of bit cells 210. It should be noted that other row numbers and column numbers could be employed, and a typical SRAM would include many more rows and columns. Each row is associated with a word line (WL) 220 (i.e., WL0, WL1, . . . , and WLn), whereas each column is associated with a pair of bit lines (i.e., BL0 232 and BLB0 236; BL1 234 and BLB1 238).

Figure 2B:
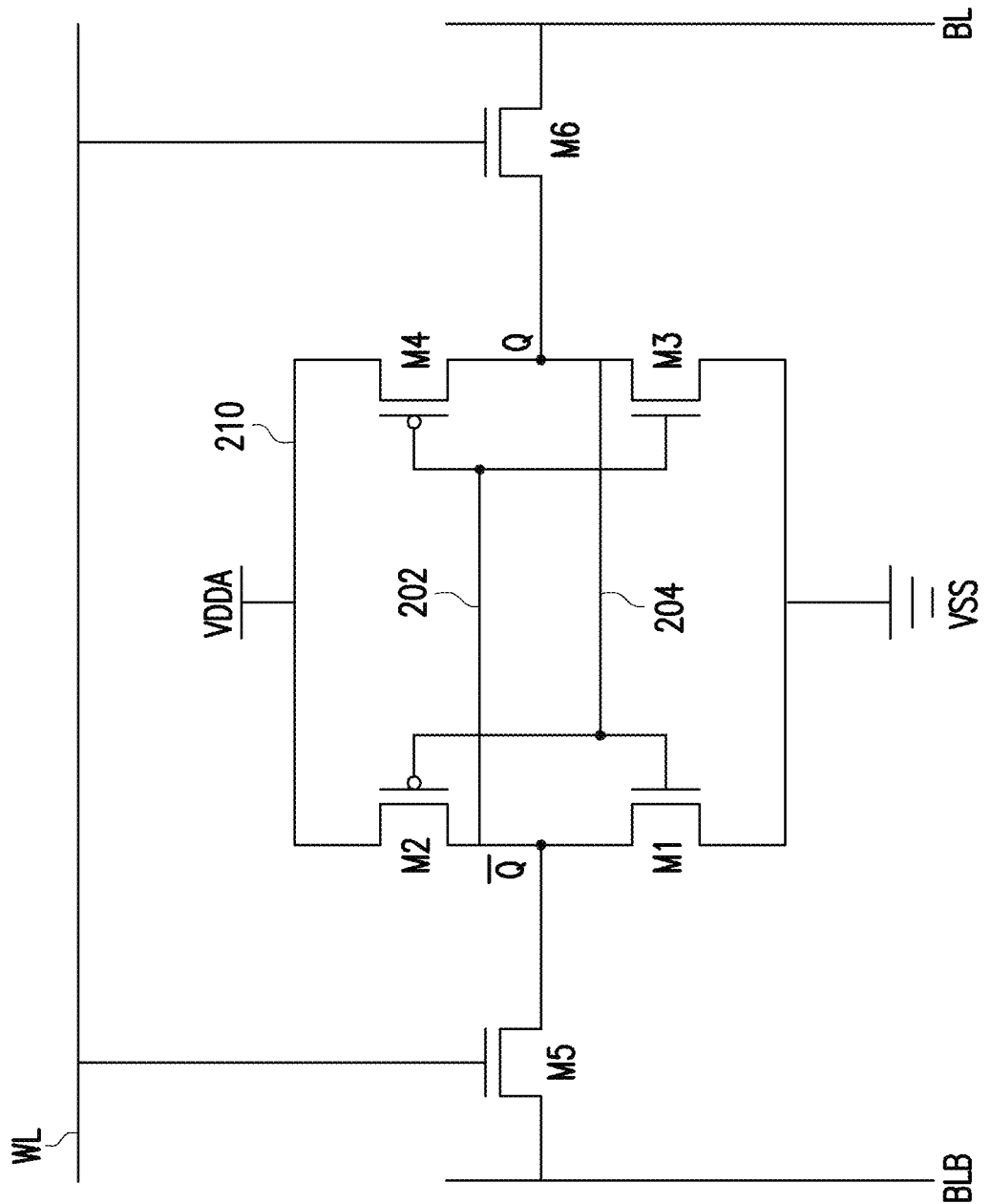
FIG. 2B is a circuit diagram illustrating an example of the bit cells which may be employed in the SRAM device of FIG. 2A in accordance with some embodiments.

FIG. 2B is a circuit diagram illustrating an example of the bit cells 210 which may be employed in the SRAM device 100 in some disclosed embodiments. The bit cell 210 includes but is not limited to a six-transistor (6T) SRAM structure. In some embodiments more or fewer than six transistors may be used to implement the bit cell 210. For example, the bit cell 210 in some embodiments may use a 4T, 8T or 10T SRAM structure, and in other embodiments may include a memory-like bit cell or a building unit. The bit cell 210 includes a first inverter formed by a NMOS/PMOS transistor pair M1 and M2, a second inverter formed by a NMOS/PMOS transistor pair M3 and M4, and access transistors/pass gates M5 and M6. Transistors M1, M3, M5 and M6 include n-type metal-oxide-semiconductor (NMOS) transistors, and transistors M2 and M4 include p-type metal-oxide semiconductor (PMOS) transistors.

The first and second inverters are cross coupled to each other via cross-coupling lines 202 and 204 to form a latching circuit for data storage. For example, the cross-coupling line 202 is coupled between the second terminals of the first inverter transistor pair, e.g. M1 and M2, and the gates of the second inverter transistor pair, e.g. M3 and M4. Similarly, the cross-coupling line 204 is coupled between the second terminals of the second inverter transistor pair, e.g. M3 and M4, and the gates of the first inverter transistor pair, e.g. M1 and M2. As such, the output of the first inverter at the node Qbar is coupled to the input of the second inverter, and the output of the second inverter at the node Q is coupled to the input of the first inverter. Power is supplied to each of the inverters, for example, a first terminal of each of transistors M2 and M4 is coupled to an array power supply voltage VDDA on a power supply terminal 240, while a first terminal of each of transistors M1 and M3 is coupled to a reference voltage VSS, for example, ground. A bit of data is stored in the bit cell 210 as a voltage level at the node Q, and can be read by circuitry via the bit line BL. Access to the node Q is controlled by the pass gate transistor M6. The node Qbar stores the complement to value at Q, e.g. if Q is "logical high," Qbar will be "logical low," and access to Qbar is controlled by the pass gate transistor M5.

A gate of the pass gate transistor M6 is coupled to one of the word lines 220. A first source/drain of the pass gate transistor M6 is coupled to a bit line BL, and a second source/drain terminal of the pass gate transistor M6 is coupled to second terminals of transistors M4 and M3 at the node Q. Similarly, a gate of the pass gate transistor M5 is coupled to the word line WL. A first source/drain terminal of the pass gate transistor M5 is coupled to a complementary bit line BLB, and a second source/drain terminal of the pass gate transistor M5 is coupled to second terminals of transistors M2 and M1 at the node Qbar (i.e., "$\overline{Q}$" or "QB").

Referring back to FIG. 2A, the word lines 220 thus control the access M5, M6 transistors in the bit cells 210, which determines which bit cells 210 are connected to corresponding pairs of bit lines. For example, for the bit cell 210 in the second row and second column, when the corresponding word line (i.e., WL1) is at logical high (1), the access transistors in the bit cell 210 are turned on. As a result, the bit cell 210 is connected to the corresponding pair of bit lines (i.e., BL1 234 and BLB1 238), which are used to transfer data for both read and write operations. A voltage VDDA is provided at a power supply terminal 240 as a supply voltage for each bit cell 210.

An SRAM power-up process may be used as part of a RNG. Upon power up, the bit cells 210 will present an initial logic state and output the initial logic state on the bit lines when the corresponding word line 220 is asserted. For example, upon power up some bit cells of a memory array will consistently default to a logic high value, other bit cells will consistently default to a logic low value. These cells may be referred to as stable 1 cells and stable 0 cells, respectively. Other bit cells will randomly vary between logic high and logic low upon power up. These cells may be referred to as unstable cells.

SRAM power-up behavior is non-deterministic random when the strength of SRAM cross-coupled inverter pairs is very close. Therefore, an SRAM can provide a random seed for an RNG. Bit cells in an SRAM cell array may end up with three different states: an unstable bit, a stable 1 bit and a stable 0 bit. The amount of SRAM cells in an array falling into one of the above mentioned states is subject to process variation. Bit cells with an unstable bit may account for a certain percentage (e.g., 5%~20%) in the whole cell array when the SRAM array operates in normal operation mode. Bit cells with a stable 1 bit and bit cells with a stable 0 bit generally are not desirable for the RNG since they are not random. For application as an RNG, it may be desirable to maximize the number of unstable bits, which could be used as a non-deterministic seed for a random number generator.

Figure 3A:
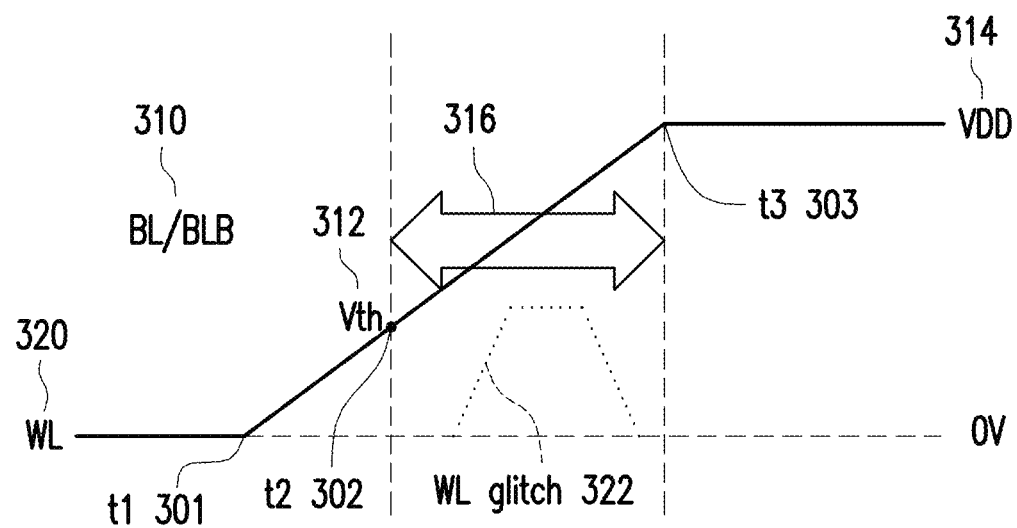
FIG. 3A and FIG. 3B are diagrams illustrating an example SRAM cell behavior when the cell is accessed in accordance with some embodiments.
Figure 3B:
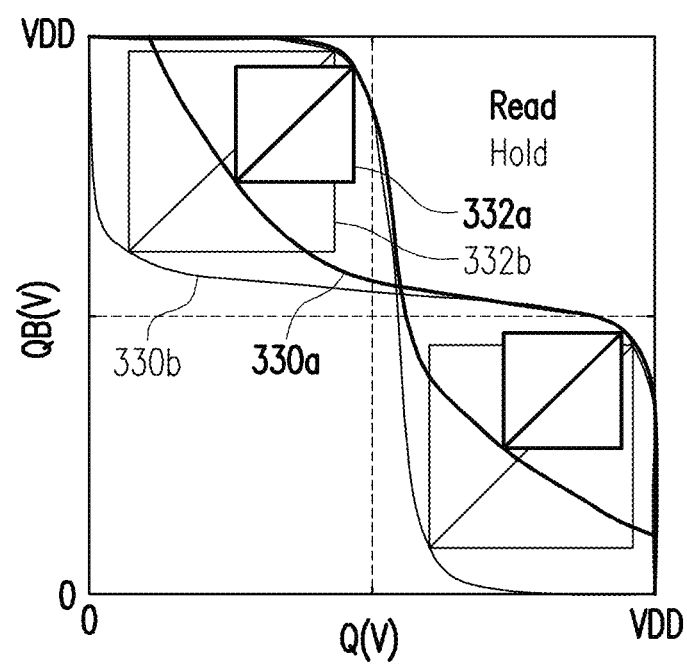

FIG. 3A and FIG. 3B illustrate the SRAM cell behavior when the cell is accessed. Specifically, when the WL signal is enabled as shown in FIG. 3A, each of the inverter in the inverter pair of the SRAM has a noise margin behavior as shown in FIG. 3B. BL and BLB are acting as inputs to the two inverters passing through M5 and M6 to Q and QBar. Since the cross-coupled inverter pair has Q and QBar (QB) as input/output and output/input respectively, FIG. 3B uses Q as input and Qbar (QB) as output for the inverter constructed with M1 and M2 as shown in FIG. 2B. The other inverter (M3 and M4) will have QB (x-axis) as input and Q as output. Both input/output curves of these two inverters are plotted in the same graph (i.e., FIG. 3B). The two squares encapsulated by the two input/output transfer curves are normally referred to as Noise Margin (NM) squares.

Figure 4B:
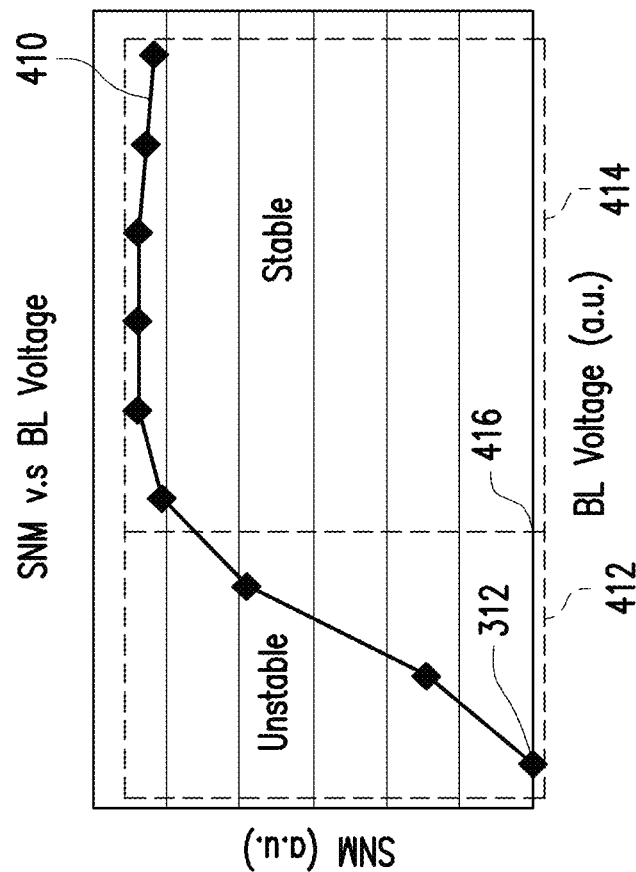
FIG. 4A and FIG. 4B illustrate an example of SRAM power-up behavior in accordance with some embodiments.
Figure 4A:
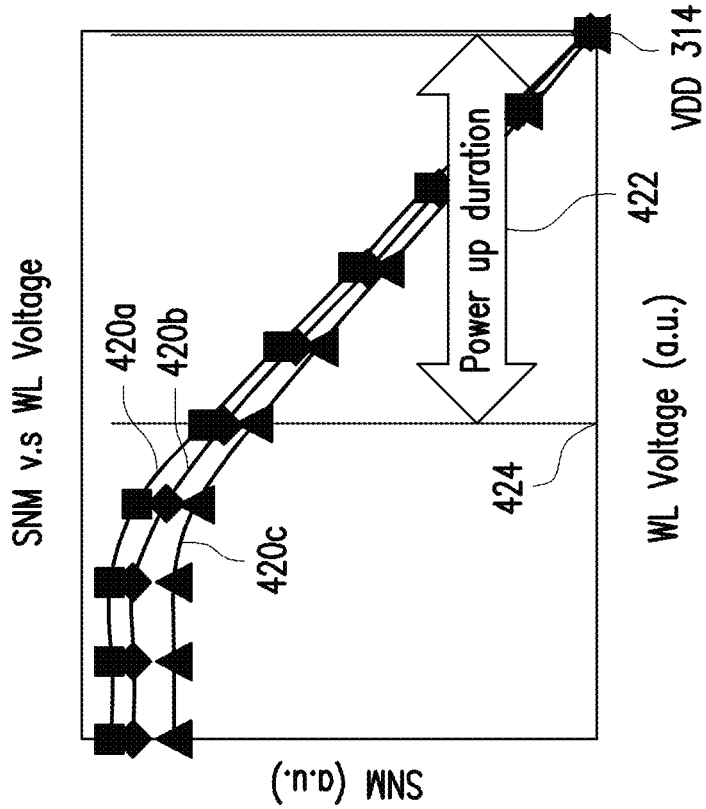

FIG. 4A and FIG. 4B illustrate an example of SRAM power-up behavior in accordance with some embodiments. Generally speaking, varying WL voltages, the existence of WL glitch and precharging BL voltage to a value in an unstable region are sources of randomness during SRAM power-up for RNG purpose.

As shown in FIG. 3A, a BL/BLB signal 310 increases from 0 to a VDD 314 during a power-up process. Specifically, the BL/BLB signal 310 is zero (i.e., bit lines not precharged) at first. At time t1 301, the BL/BLB signal 310 begins to rise (i.e., bit lines begin to be precharged). At time t2 302, the BL/BLB signal 310 rises to a threshold voltage Vth 312. Once the transistors in bit cells 210 have a gate voltage of Vth 312, those transistors in bit cells 210 are turned on. The Vth 312 varies for different process and technology nodes (e.g., 10 nm and 7 nm). In one embodiment, the Vth 312 is 0.2 V. In another embodiment, the Vth 312 is 0.5 V. At time t3, the BL/BLB signal 310 rises to the VDD 314. For a traditional SRAM, once the transistors in bit cells 210 have a gate voltage of VDD 314, those transistors in bit cells 210 are ready for read and write operations. Likewise, the VDD 314 varies for different process and technology nodes (e.g., 10 nm and 7 nm). In one embodiment, the VDD 314 is 0.75 V. In another embodiment, the VDD 314 is 0.9 V.

Static noise margin (SNM) is defined as the maximum value of static noise that can be tolerated by the cross-coupled inverters of the bit cells 210 before changing states.

In other words, when a direct current (DC) noise is larger than the SNM, the states of the bit cells 210 can change and data stored are lost. Thus, the smaller the SNM is, the more unstable the bit cells 210 are. As shown in FIG. 3B, two voltage transfer curves (VTCs) 330b correspond to the SRAM in a hold operation (i.e., a WL signal 320 is logical low and the WL signal 320 has no WL glitch). Each of the two VTCs 330b corresponds to one of the two cross-coupled inverters as discussed above. The SNM for the hold operation corresponds to the Noise Margin square 332b. Specifically, the SNM for the hold operation is the side-length of the Noise Margin square 332b, given in volts. Likewise, as shown in FIG. 3B, two voltage transfer curves (VTCs) 330a correspond to the SRAM in a read operation (i.e., the WL signal 320 is logical high or when the WL signal 320 has WL glitch). Each of the two VTCs 330a corresponds to one of the two cross-coupled inverters as discussed above. The SNM for the read operation corresponds to the Noise Margin square 332a. Specifically, the SNM for the hold operation is the side-length of the Noise Margin square 332a, given in volts. The SNM for the read operation is smaller than the SNM for the hold operation, meaning that the bit cells 210 are more unstable during the read operation than during the hold operation.

As further shown in FIG. 4A, the SNM decreases as the WL voltage increases. As the WL voltage increases, the SNM v. WL voltage curves 420a, 420b and 420c drop considerably in the power-up duration 422. The power-up duration 422 is the WL voltage range between a WL threshold voltage 424 and the VDD 314. In other words, when the SRAM transforms from the hold operation (i.e., the WL voltage is logical low) to the read/write operation (i.e., the WL voltage is logical high (i.e., the VDD 314)), the SNM decreases. Thus, the nature of varying WL voltages during SRAM power-up is a source of randomness for RNG purpose.

On the other hand, as shown in FIG. 3A, even if the WL signal 320 is intended to be logical low (0), there might be WL glitches (e.g., a WL glitch 322). When the WL glitch 322 is large enough (e.g., larger than the WL threshold voltage 424), the SNM drops considerably (e.g., from the square 332b to the square 332a). In other words, the WL glitch 322 further makes the bit cells 210 unstable due to small SNM. Therefore, the existence of WL glitch 322 during SRAM power-up is also a source of randomness for RNG purpose.

Additionally, as shown in FIG. 4B, the SNM increases as the BL voltage increases. Specifically, the SNM is relatively small (i.e., the bit cells 210 are relatively unstable) when the BL voltage is relatively low. As the BL voltage increases over a BL threshold voltage 416, the SNM is relatively large (i.e., the bit cells 210 are relatively unstable) and does not increase significantly. In other words, the SNM v. BL voltage curve 410 has two ranges: an unstable range 412 and a stable range 414. The unstable range 412 is a BL voltage range from the Vth 312 and the BL threshold voltage 416. In one embodiment, the BL threshold voltage 416 is 90% of the VDD 314. In another embodiment, the BL threshold voltage 416 is 85% of the VDD 314. In yet another embodiment, the BL threshold voltage 416 is 80% of the VDD 314. It should be noted that various values of the BL threshold voltage 416 are within the contemplated scope of the present disclosure. By precharging the BL/BLB signal 310 to a value in the unstable region 412 (i.e., a BL voltage between the Vth 312 and the BL threshold voltage 416) rather than the VDD 314, the bit cells 210 are unstable due to small SNM. Therefore, precharging the BL/BLB signal 310 to a value in the unstable region 412 is yet another source of randomness for RNG purpose.

Figure 5:
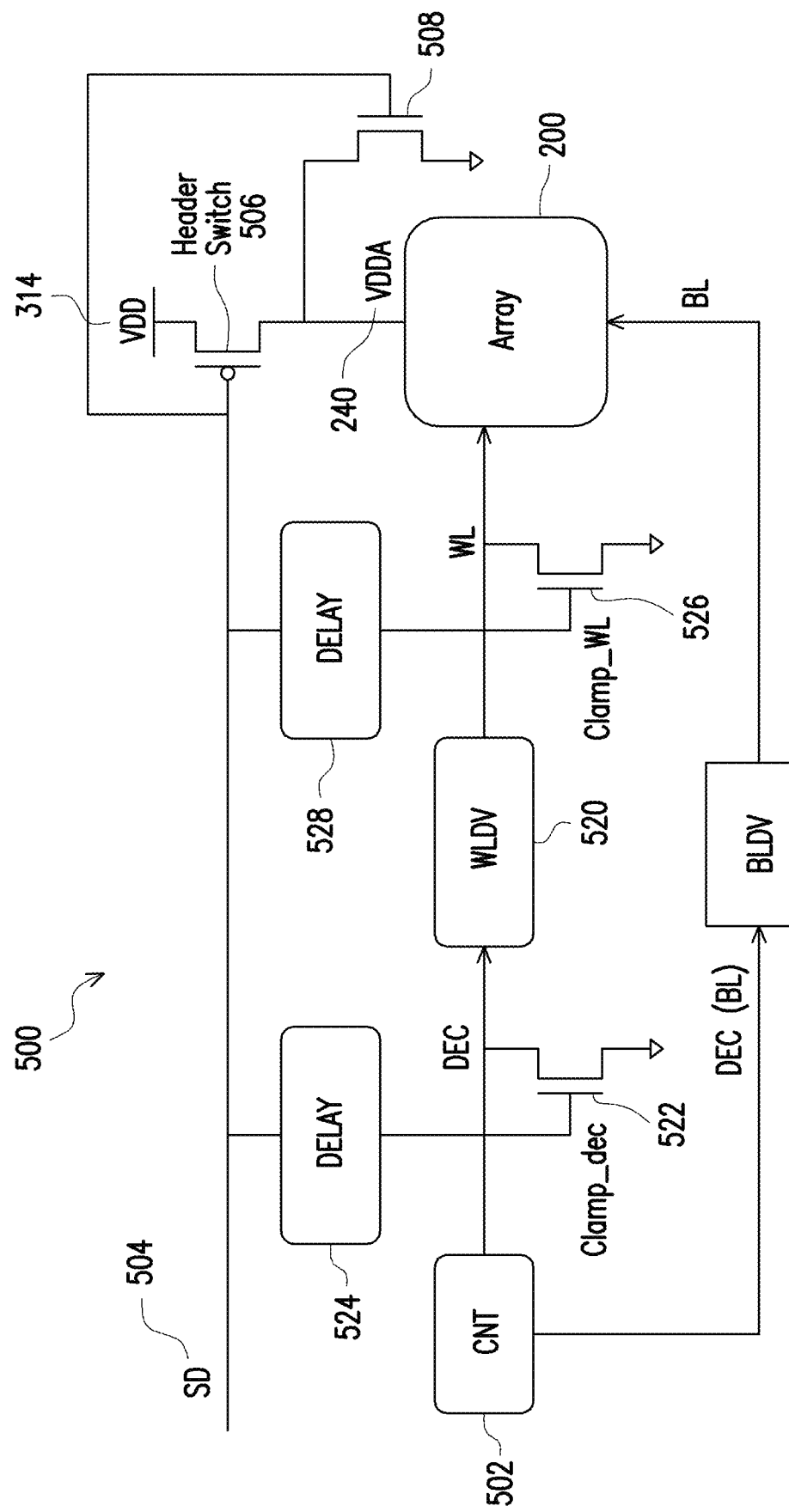
FIG. 5 is a block diagram of an example of SRAM power-up RNG in accordance with some embodiments.

FIG. 5 shows an example SRAM power-up RNG 500, in accordance with some embodiments. FIG. 6 shows an example of timing diagrams 600 of an example of the SRAM power-up RNG 500, in accordance with some embodiments. As shown in FIG. 5, the example SRAM power-up RNG 500 includes the control circuit 502 (which may combine the memory controller 102 and the RNG controller 104 shown in FIG. 1), a word line driver 520, a bit line driver 510, the cell array 200, a first clamp transistor 522, a second clamp transistor 526, a first delay circuit 524, a second delay circuit 528, a shutdown (SD) signal 504, a header switch 506, and a leakage transistor 508. The SRAM power-up RNG 500 may include other components not shown in FIG. 5, and in some embodiments, only one of the first or second delay circuits 524, 258 and first or second clamp transistors 522, 526 are included. In example embodiments, the SRAM power-up RNG 500 may be part of an integrated circuit (IC) chip.

The control circuit 502 generates an address decode signal DEC. The word line driver 520 receives the decode signal DEC and generates a word line signal WL, which is output to the selected word line 220 of the array 200. On the other hand, the control circuit 502 generates another address decode signal DEC (BL). The bit line driver 510 receives the decode signal DEC (BL) and generates a bit line signal BL which is output to the selected bit line pair(s) of the array 200. The cell array 200 receives both the word line signal WL and the bit line signal BL, which in turn control the operation of the cell array 200.

The shutdown signal SD 504 is fed to a gate of the first clamp transistor 522 through the first delay circuit 524. A drain of the first clamp transistor 522 is connected to ground, whereas a source of the first clamp transistor 522 is connected to the word line driver 520. In the illustrated example, the shutdown signal SD 504 is also fed to a gate of the second clamp transistor 526 through the second delay circuit 528. A drain of the second clamp transistor 526 is connected to ground, whereas a source of the second clamp transistor 526 is connected to the cell array 200. In one embodiment, the first clamp transistor 522 and the second clamp transistor 526 are NMOS transistors. It should be noted that, various clamp transistors or circuits are within the contemplated scope of the present disclosure. In one embodiment, the first delay circuit 524 or alternatively the second delay circuit 528 has two or more inverters connected in series. It should be noted that, various delay circuits are within the contemplated scope of the present disclosure.

The shutdown signal SD 504 is further fed to a gate of the header switch 506 and a gate of the leakage transistor 508. In one embodiment, the header switch 506 is a PMOS transistor. In one embodiment, the leakage transistor 508 is a NMOS transistor. A source of the header switch 506 is connected to the VDD 314 (a logic periphery power supply voltage), and a drain of the header switch 506 is connected to the cell array 200 (i.e., having the voltage VDDA 240). A source of the leakage transistor 508 is connected to the cell array 200 (i.e., having the voltage VDDA 240), and a drain of the leakage transistor 508 is connected to ground. The operation of the leakage transistor 508 will be described in detail below.

As shown in FIG. 6, the shutdown signal SD 504 is logical high (1) before time t1 601. The shutdown signal SD 504 is fed to the gate of the header switch 506, and the header switch 506 is a PMOS transistor in one embodiment. Therefore, the header switch 506 is turned off when the shutdown signal SD 504 is logical high (1). Therefore, the voltage VDDA 240 (i.e., the supply voltage for each bit cell 210 in the cell array 200) is not pulled up to the VDD 314. In other words, the bit cells 210 have not woken up before time t1 601. At time t1 601, the shutdown signal SD 504 toggles from logical high (1) to logical low (0). Again, the shutdown signal SD 504 is fed to the gate of the header switch 506, and the header switch 506 is a PMOS transistor in one embodiment. Therefore, the header switch 506 is turned on when the shutdown signal SD 504 is logical low (0). Therefore, the voltage VDDA 240 (i.e., the supply voltage for each bit cell 210 in the cell array 200) is pulled up to VDD. In other words, the bit cells 210 begin to wake up after time t1 601 in a power-up phase in response to the shutdown signal 504. The SRAM power-up RNG 500 operates in a RNG phase during an RNG phase 612 after time t1 601, which is followed by a SRAM operation phase 614. Specifically, during the RNG operation phase 612, the signal BL/BLB 310 at a value in the unstable region 412 (i.e., a BL voltage between the Vth 312 and the BL threshold voltage 416) rather than the VDD 314, and as such, the bit lines are precharged to a value below VDD in the unstable region 412. The WL signal 320 is generally held at a logical low (0) (discussed further below), and the SRAM power-up RNG 500 operates as a RNG (i.e., generating unstable bits 112). During the SRAM operation phase 614, the signal BL/BLB 310 rises to the VDD 314, and the SRAM power-up RNG 500 operates as a SRAM (i.e., conducting hold, read and write operations).

During the RNG operation phase 612, the bit line signal BL of the SRAM power-up RNG 500 is precharged to a value in the unstable region 412 (i.e., a BL voltage between the Vth 312 and the BL threshold voltage 416) rather than the VDD 314, as mentioned above. Thus, the bit cells 210 are unstable due to small SNM corresponding to the unstable region 412. In this way, precharging the BL/BLB signal 310 to a value in the unstable region 412 improves randomness of the SRAM power-up RNG 500 during the RNG operation phase 612.

Further, during the RNG operation phase 612, the nature of varying WL voltages during SRAM power-up is a source of randomness, as mentioned above. The existence of a WL glitch 322 during SRAM power-up is also a source of randomness, as mentioned above. In one embodiment, the shutdown signal SD 504 is fed to the gate of the first clamp transistor 522 through the first delay circuit 524. Thus, the signal Clamp_DEC at the gate of the clamp transistor 522 is a delay of the shutdown signal SD 504. As shown in FIG. 6, they delay between the shutdown signal SD 504 and the signal Clamp_DEC is defined by a delay period 602. When the signal Clamp_DEC is logical high (1), the first clamp transistor 522 which is a NMOS transistor in one embodiment is turned on, thereby pulling the signal DEC down to ground. In some examples, the delay 602 is variable (i.e., changing every time the SRAM power-up RNG 500 is powered up). Such operation may initiate the WL glitch 322. In other words, the first clamp transistor 522 remains off for the delay period 602, while the Clamp_WL signal transition is not delayed (or delayed less) so the second clamping transistor 526 turns on before the first clamping transistor 522. In this manner, the delay period 602 introduces the impact of potential WL glitch 322, thereby improving randomness of the SRAM power-up RNG 500 during the RNG operation phase 612. In some embodiments, the delay period 602 is varied. For example, in one embodiment the variable delay 602 might be zero for the current power-up. In another embodiment, the variable delay 602 might be 30% of the delay 602 as shown in FIG. 6 for the current power-up. In yet another embodiment, the variable delay 602 might be 80% of the delay 602 as shown in FIG. 6 for the current power-up.

Likewise, in another embodiment, the shutdown signal SD 504 is fed to the gate of the second clamp transistor 526 through the second delay circuit 528. The operation of the signal Clamp_WL and the WL signal 320 is the same as that of the signal Clamp_DEC and the decode signal DEC, which is not repeated for simplicity.

Moreover, as mentioned above, the header switch 506 is turned off when the shutdown signal SD 504 is logical high (1). However, without the leakage transistor 508, the voltage VDDA 240 (i.e., the supply voltage for each bit cell 210 in the cell array 200) is not pulled completely to ground (i.e. not at zero volts) due to the size and leakage of the header switch 506. This could result in the application of a voltage to the bit cells 210 in the cell array 200 during the shutdown phase (i.e. when the shutdown signal SD 504 is logical high (1)), which could make some bit cells initially biased to logical high (1) or logical low (0), thereby decreasing the randomness of the SRAM power-up RNG 500.

In contrast, with the leakage transistor 508, the voltage VDDA 240 is pulled very close to zero. Specifically, in one embodiment, the leakage transistor 508 is a NMOS transistor. When the shutdown signal SD 504 is logical high (1), the leakage transistor 508 is turned on, thereby pulling the voltage VDDA 240 down to ground. The saturation current Isat of the leakage transistor 508 is chosen to be higher than the leakage current of the header switch 506. In other words, the leakage transistor 508 provides an additional path to drain the leakage current of the header switch 506. In this manner, by decreasing the voltage VDDA 240 to very close to zero, there are less initially biased bit cell data, thereby improving the randomness of the SRAM power-up RNG 500.

Figure 7A:
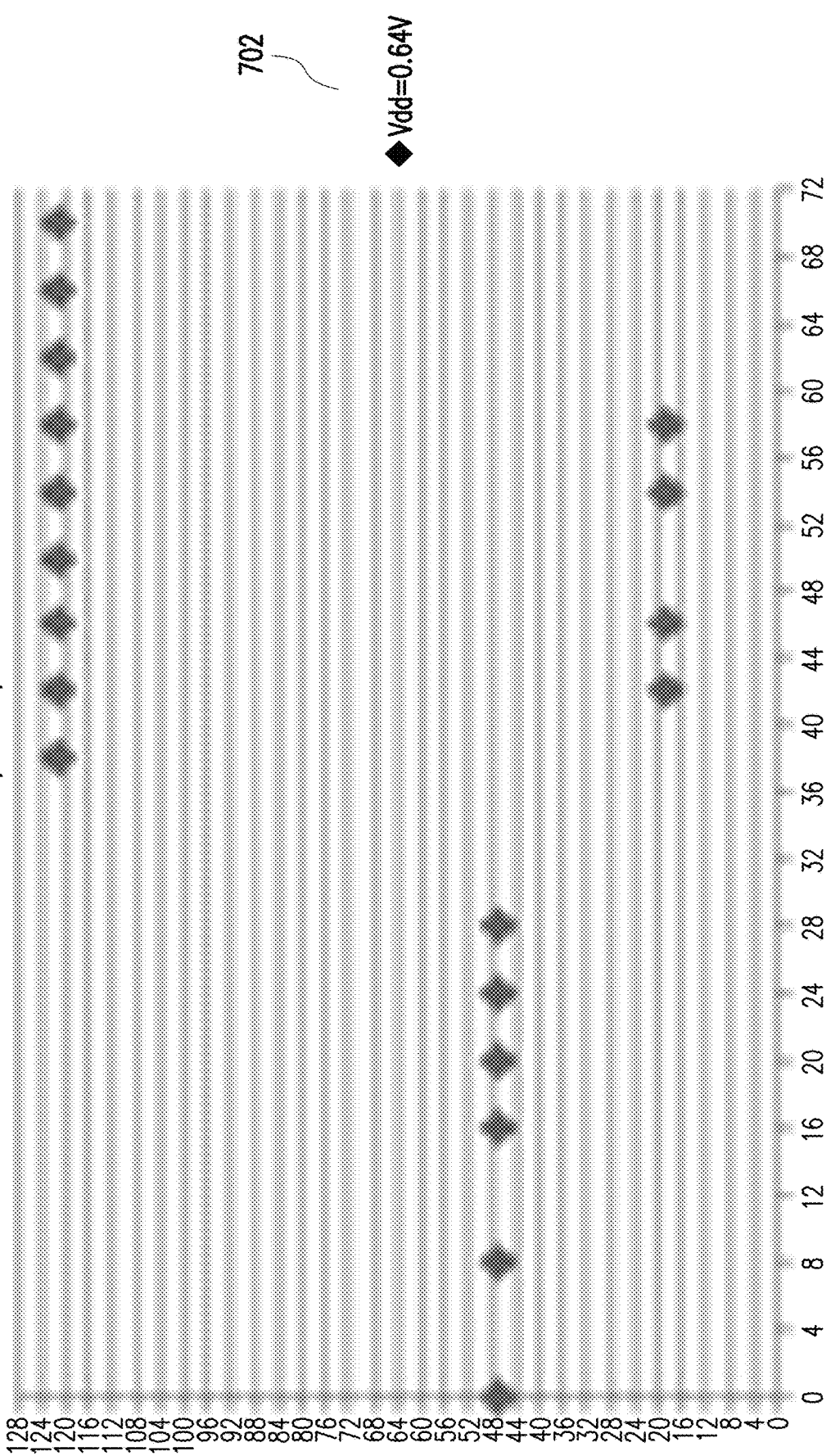
FIG. 7A-7C illustrate example relationships between randomness of the SRAM power-up RNG and loop times in accordance with some embodiments.
Figure 7B:
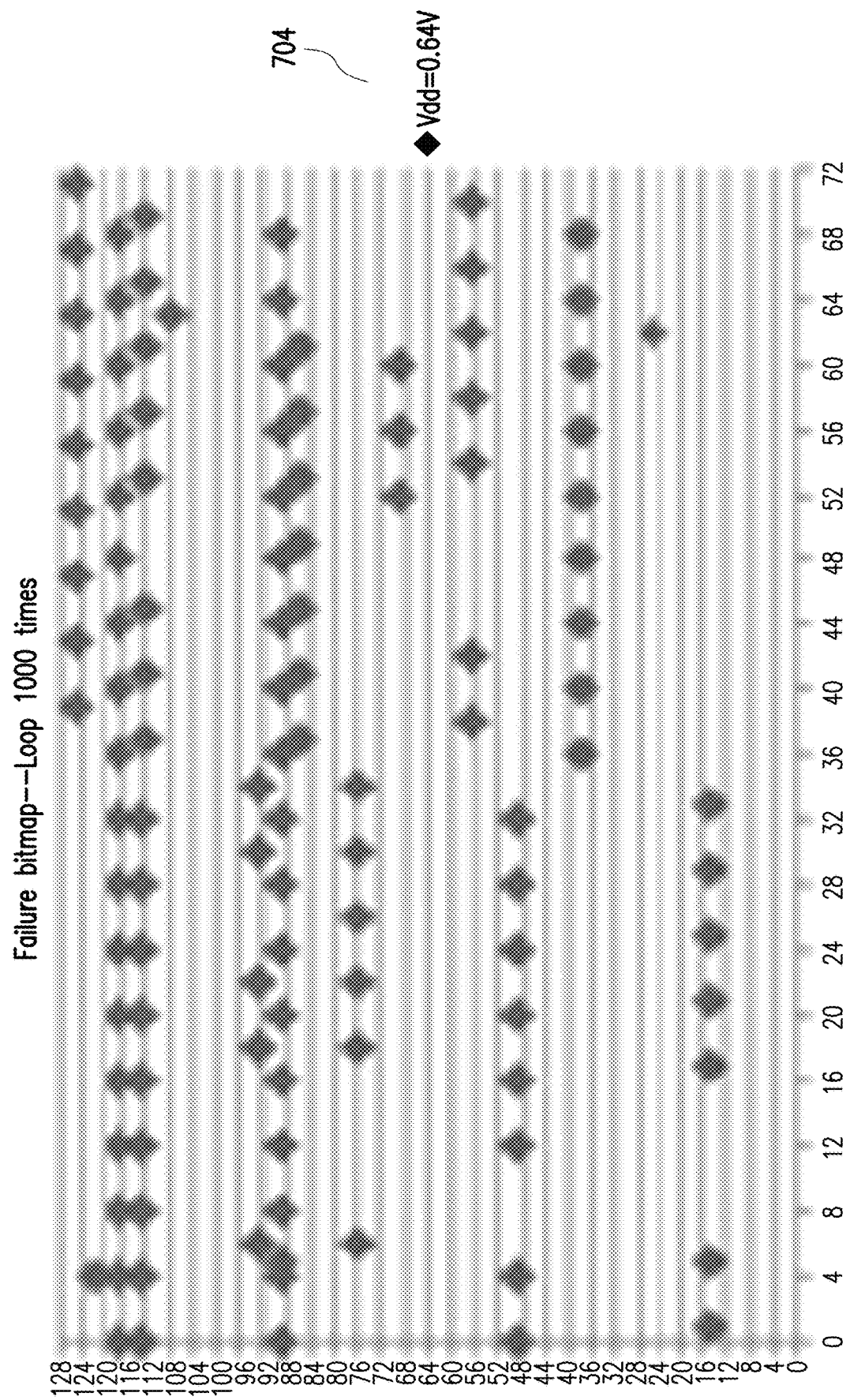
Figure 7C:
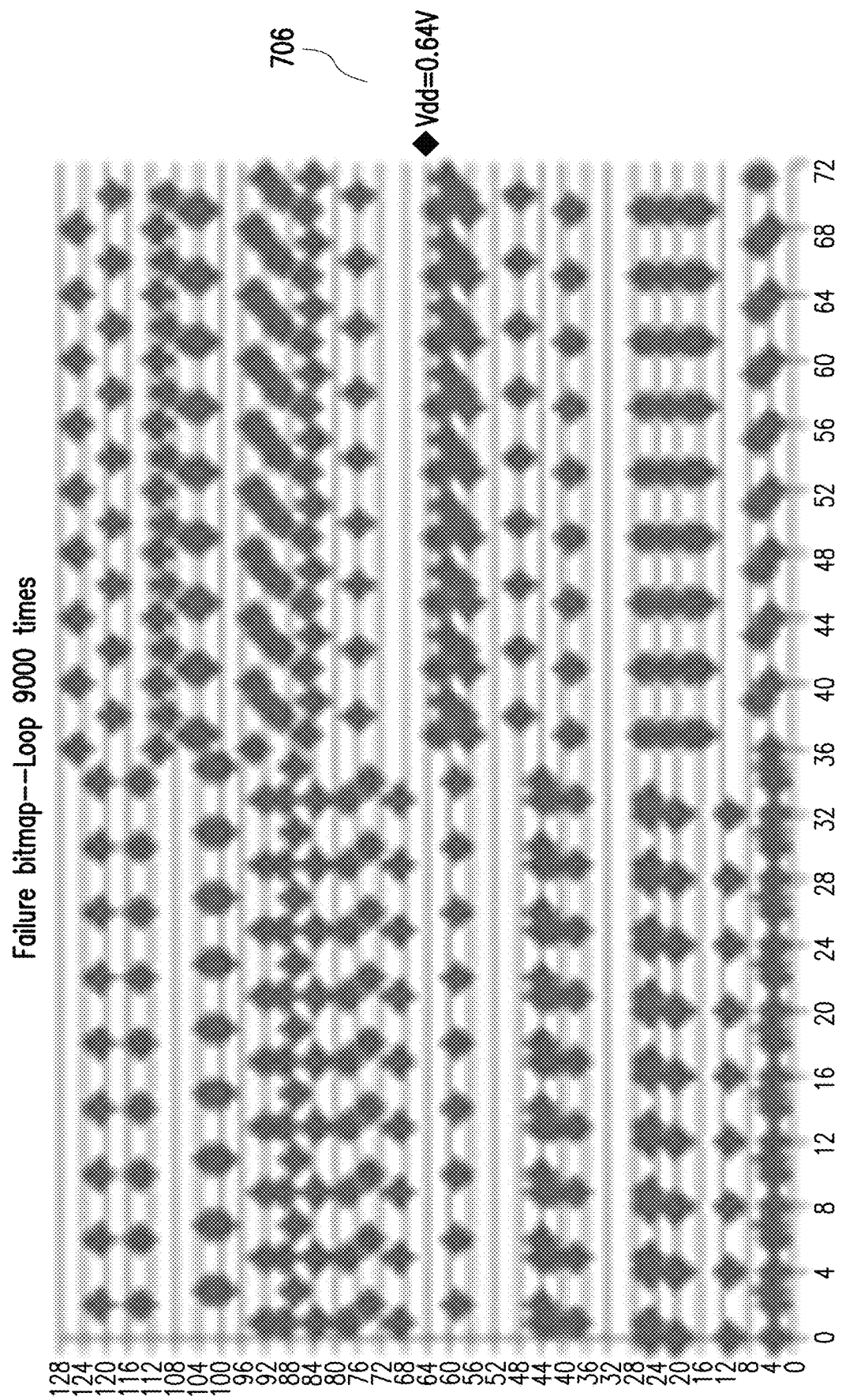

FIG. 7A-7C illustrate example relationships between randomness of the SRAM power-up RNG 500 and power down/up looping, in accordance with some embodiments. Specifically, failure bitmaps 702, 704, 706 illustrate examples of the counts and addresses of failure bits for various power down/up looping of the SRAM power-up RNG 500. The failure bitmap 702 in FIG. 7A shows examples of the counts and addresses of failure bits of the SRAM power-up RNG 500 following a single power loop; the failure bitmap 704 in FIG. 7B shows examples of the counts and addresses of failure bits of the SRAM power-up RNG 500 following one thousand power loops; and the failure bitmap 706 in FIG. 7C shows examples of the counts and addresses of failure bits of the SRAM power-up RNG 500 following nine thousand power loops. Thus, cycling the device power prior to implementing the RNG 500 may improve randomness of the RNG.

Figure 8:
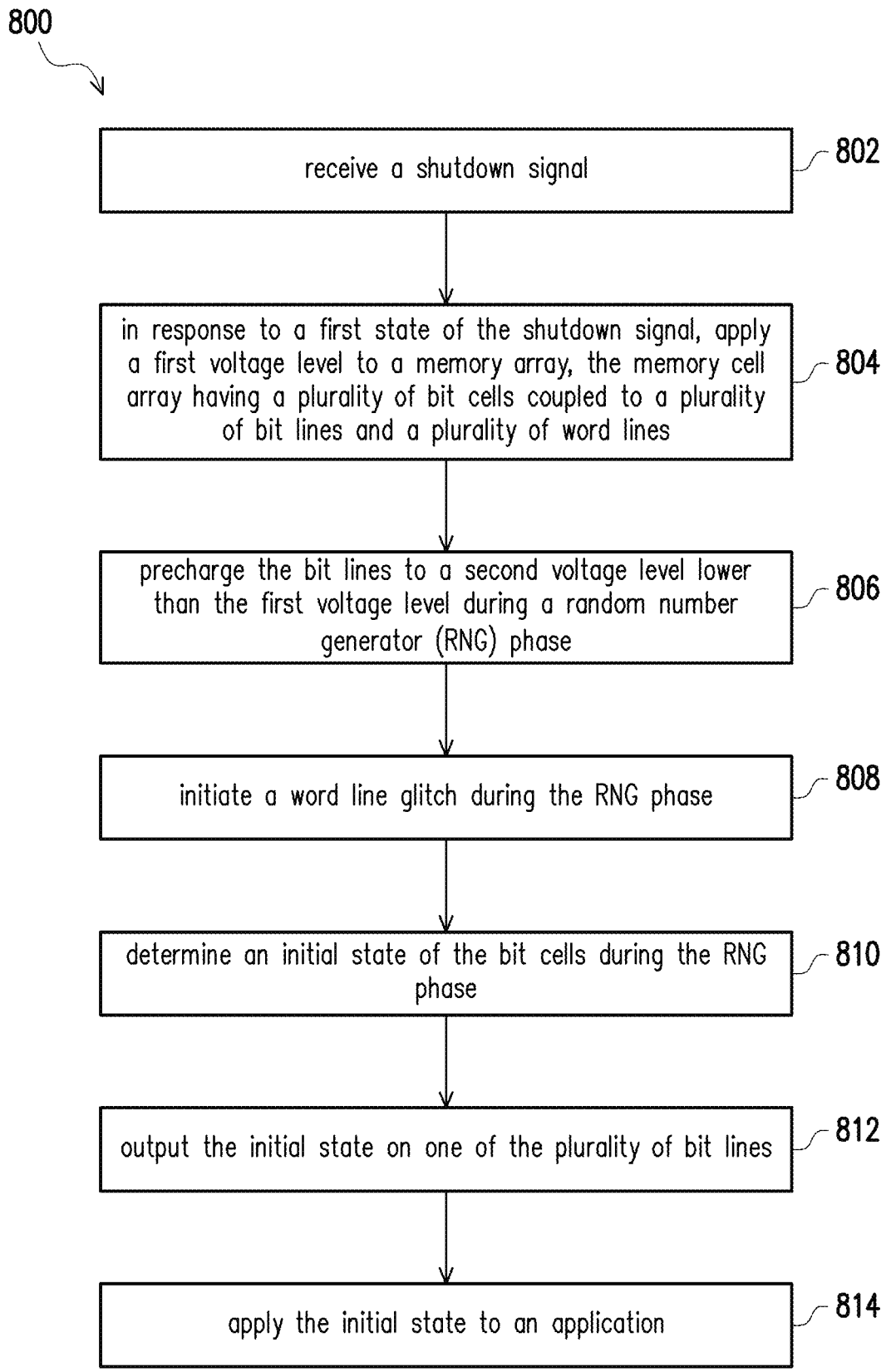
FIG. 8 is a flow chat of an example method for operating a SRAM power-up RNG in accordance with some embodiments.

FIG. 8 is a flow chart of an example method 800 for operating a SRAM power-up RNG in accordance with some embodiments. In step 802 a shutdown signal SD is received. In response to a first state (i.e., a logical low state) of the shutdown signal, a first voltage level 414 is applied to a memory array 200 in step 804. As noted above, examples of the memory cell array 200 have a plurality of bit cells 210 that are coupled to a plurality of bit lines and a plurality of word lines. In step 806, the bit lines are precharged to a second voltage level 412 lower than the first voltage level during a random number generator (RNG) phase 612. Further, in some embodiments, a word line glitch is initiated during the RNG phase in step 808. In step 810, an initial state of the bit cells is determined during the RNG phase to generate a random number. In step 812, the initial state is output on one of the plurality of bit lines. In step 814, the initial state is applied to an application such as security, cryptography, computer simulation, statistical sampling, completely randomized design, gaming, and gambling.

Thus, disclosed embodiments include a memory device that has a plurality of bit lines, a plurality of word lines, and a memory cell array including a plurality of bit cells coupled to the bit lines and the word lines. Each of the bit cells is configured to present an initial logic state on the bit lines. A power supply terminal is coupled to the memory cell array. A controller is coupled to the word lines and the bit lines, and is configured to, during a RNG phase, precharge the bit lines to a second voltage level lower than a first voltage level, and determine the initial logic states of the plurality of bit cells to generate a random number. The first voltage level is a voltage level for operating the memory cell array during an SRAM phase.

In accordance with other embodiments, a RNG includes a memory cell array having a plurality of bit cells coupled to a plurality of bit lines and a plurality of word lines. Each of the bit cells includes a plurality of transistors and is configured to present an initial logic state when the RNG is powered up and output the initial logic state on the bit lines. A power supply terminal is coupled to the memory cell array and is configured to provide a first voltage level to the memory cell array. An input terminal is configured to receive a shutdown signal. A header switch is connected between the power supply terminal and the memory cell array, and is responsive to the shutdown signal. A word line driver is coupled to the cell array and is configured to output a word line signal to the memory cell array. A delay circuit is connected between the input terminal and the word line driver, and is configured to delay the output of the word line signal to the word line driver in response to the shutdown signal, such that the shutdown signal is received by the header switch before the word line signal is received by memory array.

In accordance with further embodiments, a method includes receiving a shutdown signal, and in response to a first state of the shutdown signal, applying a first voltage level to a memory array. The memory cell array has a plurality of bit cells coupled to a plurality of bit lines and a plurality of word lines. The bit lines are precharged to a second voltage level lower than the first voltage level during a RNG phase. A word line glitch is initiated during the RNG phase. An initial state of the bit cells is determined during the RNG phase.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a plurality of bit lines;
   a plurality of word lines;
   a memory cell array including a plurality of bit cells coupled to the bit lines and the word lines, each of the bit cells configured to present an initial logic state on the bit lines;
   a power supply terminal coupled to the memory cell array;
   an address decoder configured to output a memory address signal;
   a word line driver configured to receive the memory address signal and output a word line signal;
   an input terminal configured to receive a shutdown signal; and
   a header switch connected between the first voltage level and the memory cell array, wherein the header switch is configured to be turned off in response to a first state of the shutdown signal and
   a controller coupled to the word lines and the bit lines, the controller configured to:
   during an RNG phase, precharge the bit lines and determine the initial logic states of the plurality of bit cells to generate a random number.

2. The memory device of claim 1, wherein the controller is further configured to:
   during an SRAM phase, operate the memory cell at a first voltage level; and
   during the RNG phase, initiate a word line glitch.

3. The memory device of claim 1, wherein the controller is further configured to:
   during the RNG phase, precharge the bit lines to a second voltage level lower than the first voltage level.

4. The memory device of claim 1, further comprising a first delay circuit coupled to the input terminal and configured to delay the shutdown signal by a first delay period.

5. The memory device of claim 1, further comprising:
   a leakage transistor connected between the header switch and a ground voltage level, wherein the leakage transistor is configured to be turned on in response to the first state of the shutdown signal.

6. The memory device of claim 4, further comprising:
   a first clamp transistor coupled to the first delay circuit and configured to pull the memory address signal to the ground voltage level in response to the shutdown signal delayed by the first delay period.

7. The memory device of claim 6, further comprising:
   a second clamp transistor configured to pull the word line signal to the ground voltage level in response to the shutdown signal.

8. The memory device of claim 7, further comprising a second delay circuit coupled to the input terminal and configured to delay the shutdown signal by a second delay period; and
   wherein the second clamp switch is configured to pull the word line signal to the ground voltage level in response to the delayed shutdown signal delayed by the second delay period.

9. The memory device of claim 8, wherein the first delay period is different than the second delay period.

10. The memory device of claim 4, wherein the controller is configured to power the memory cell array up and down a predetermined number of cycles before receiving the shutdown signal.

11. A method, comprising:
   applying a first voltage level to a memory cell array, the memory cell array having a plurality of bit cells coupled to a plurality of bit lines and a plurality of word lines;
   initiating a word line glitch;
   generating a random number based on an initial state of each of the plurality of bit cells in response to the word line glitch;
   receiving a shutdown signal; and
   in response to the shutdown signal, applying the first voltage level to the memory cell array.

12. The method of claim 11, further comprising powering the memory cell array up and down a predetermined number of cycles before receiving the shutdown signal.

13. The method of claim 11, further comprising precharging the plurality of bit lines to a second voltage level lower than the first voltage level during a random number generator (RNG) phase during which the random number is generated.

14. The method of claim 13, wherein determining the initial state of each of the plurality of bit cells during the RNG phase occurs before the bit cells are powered up to the first voltage level.

15. The method of claim 12, further comprising:
   applying the shutdown signal at a first time point to a header switch configured to apply the first voltage level to the memory cell array in response to the shutdown signal.

16. The method of claim 11, wherein initiating the word line glitch includes:
   applying a shutdown signal at a first time point to a header switch configured to apply the first voltage level to the memory cell array in response to the shutdown signal;
   applying the shutdown signal to a first clamp switch at the first time point to hold an address decode signal at a first signal level; and
   applying the shutdown signal to a second clamp switch at a second time point later than the first time point to hold a word line signal at the first signal level.

17. The method of claim 16, further comprising:
   providing a path to ground for the header switch in response to the shutdown signal.

18. A method, comprising:
   receiving a shutdown signal;
   in response to the shutdown signal, applying a first voltage level to a memory array, the memory cell array having a plurality of bit cells coupled to a plurality of bit lines and a plurality of word lines;
   precharging the bit lines to a second voltage level lower than the first voltage level during a random number generator (RNG) phase;
   determining an initial state of the bit cells during the RNG phase; and
   powering the memory cell array up and down a predetermined number of cycles before receiving the shutdown signal.

19. The method of claim 18, further comprising:
   applying the shutdown signal at a first time point to a header switch configured to apply the first voltage level to the memory cell array in response to the shutdown signal;
   applying the shutdown signal to a first clamp switch at the first time point to hold an address decode signal at a first signal level; and
   applying the shutdown signal to a second clamp switch at a second time point later than the first time point to hold a word line signal at the first signal level.

20. The method of claim 19, further comprising turning on a leakage transistor in response to the shutdown signal.

* * * * *